(12) United States Patent
Chiu (10) Patent No.: US 12,411,607 B2
(45) Date of Patent: Sep. 9, 2025

(54) CONTINUOUS MEMORY ACCESS ACCELERATION CIRCUIT, ADDRESS SHIFT CIRCUIT AND ADDRESS GENERATION METHOD

(71) Applicant: Nuvoton Technology Corporation, Hsinchu (TW)

(72) Inventor: Hung-Wei Chiu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 197 days.

(21) Appl. No.: 17/973,555

(22) Filed: Oct. 26, 2022

(65) Prior Publication Data

US 2023/0418473 A1    Dec. 28, 2023

(30) Foreign Application Priority Data

Jun. 24, 2022    (TW) .................................. 111123756

(51) Int. Cl.
  *G06F 3/06*    (2006.01)
(52) U.S. Cl.
  CPC .......... *G06F 3/0613* (2013.01); *G06F 3/0629* (2013.01); *G06F 3/0673* (2013.01)
(58) Field of Classification Search
  CPC ..... G06F 3/0613; G06F 3/0629; G06F 3/0673
  See application file for complete search history.

(56) References Cited

U.S. PATENT DOCUMENTS

| | | | | |
|---|---|---|---|---|
| 5,450,460 A | * | 9/1995 | Stodieck | H03K 21/403 377/44 |
| 5,612,926 A | * | 3/1997 | Yazawa | H04N 5/907 386/E5.067 |
| 6,006,345 A | * | 12/1999 | Berry, Jr. | G11C 29/20 714/718 |
| 2004/0125415 A1 | * | 7/2004 | Michiie | H04N 1/32358 710/22 |
| 2015/0317260 A1 | | 11/2015 | Togano | |
| 2018/0314528 A1 | * | 11/2018 | Zhu | G06T 1/60 |

FOREIGN PATENT DOCUMENTS

| | | |
|---|---|---|
| CN | 101611384 | 12/2009 |
| TW | 201432275 | 8/2014 |

* cited by examiner

*Primary Examiner* — Eric T Oberly
(74) *Attorney, Agent, or Firm* — JCIPRNET (57) ABSTRACT

A continuous memory access acceleration circuit, an address shift circuit, and an address generation method are provided. An arithmetic circuit calculates a memory access address according to temporary data provided by a register circuit. A counter provides a count value. A counting control circuit controls the counter to accumulate the count value according to access times of a memory. An adder circuit adds the memory access address and the count value to generate a target memory access address.

14 Claims, 5 Drawing Sheets

--- calculate a memory access address according to temporary data provided by a register circuit — S502 provide a counting control circuit and a counter, and control, by the counting control circuit, the counter to accumulate a count value according to access times of a memory — S504 provide an adder circuit, and add, by the adder circuit, the memory access address and the count value to generate a target memory access address — S506

CONTINUOUS MEMORY ACCESS ACCELERATION CIRCUIT, ADDRESS SHIFT CIRCUIT AND ADDRESS GENERATION METHOD

CROSS-REFERENCE TO RELATED APPLICATION

This application claims the priority benefit of Taiwan application serial no. 111123756, filed on Jun. 24, 2022. The entirety of the above-mentioned patent application is hereby incorporated by reference herein and made a part of this specification.

BACKGROUND

Technical Field

The disclosure relates to a processor acceleration device, and more particularly, to a continuous memory access acceleration circuit, an address shift circuit, and a memory address generation method.

Description of Related Art

A digital signal processor (DSP) is often used for digital signal processing, such as a finite impulse response (FIR) filter, an unnecessary infinite impulse response (IIR) filter, a biquad filter, and the like. Implementing these filters often requires a large number of repetitive operations and memory accesses, which require the execution of a large number of instructions. In order to save cost or improve performance, designers often use different coding methods to design digital signal processing programs. However, no matter how the code is written, it is often difficult to optimize memory accesses, and the performance of the digital signal processor may not be further improved.

SUMMARY

The disclosure provides a continuous memory access acceleration circuit, an address shift circuit, and an address generation method, which may effectively optimize the continuous memory access and improve the efficiency of performing digital signal processing.

The disclosure provides a continuous memory access acceleration circuit including a register circuit, an arithmetic circuit, and an address shift circuit. The arithmetic circuit is coupled to the register circuit, and calculates a memory access address according to temporary data provided by the register circuit. The address shift circuit is coupled to the register circuit and the arithmetic circuit. The address shift circuit includes a counter, a counting control circuit, and an adder circuit. The counter provides a count value. The counting control circuit is coupled to the counter, and controls the counter to accumulate the count value according to access times of a memory. The adder circuit is coupled to the register circuit and the counter, and adds the memory access address and the count value to generate a target memory access address.

In an embodiment of the disclosure, the counting control circuit controls the counter to accumulate the count value in response to the access times of the memory reaching a preset number of times.

In an embodiment of the disclosure, the counting control circuit sets the preset number of times according to a setting signal.

In an embodiment of the disclosure, the register circuit provides the setting signal.

In an embodiment of the disclosure, the preset number of times is 2.

In an embodiment of the disclosure, the counting control circuit determines the access times of the memory according to a memory access enable signal.

In an embodiment of the disclosure, the address shift circuit further includes a switching circuit coupled to the register circuit and the counting control circuit, and receiving the memory access enable signal. The register circuit controls a turn-on state of the switching circuit to determine whether to enable the counting control circuit to receive the memory access enable signal.

In an embodiment of the disclosure, the memory access enable signal is a clock signal, and the counting control circuit is a prescaler.

The disclosure further provides an address shift circuit of a continuous memory access acceleration circuit, including a counter, a counting control circuit, and an adder circuit. The counter provides a count value. The counting control circuit is coupled to the counter, and controls the counter to accumulate the count value according to access times of a memory. The adder circuit is coupled to the counter, and adds a memory access address and the count value to generate a target memory access address.

In an embodiment of the disclosure, the counting control circuit controls the counter to accumulate the count value in response to the access times of the memory reaching a preset number of times.

In an embodiment of the disclosure, the counting control circuit sets the preset number of times according to a setting signal.

In an embodiment of the disclosure, the setting signal is from a register circuit.

In an embodiment of the disclosure, the preset number of times is 2.

In an embodiment of the disclosure, the counting control circuit determines the access times of the memory according to a memory access enable signal.

In an embodiment of the disclosure, the address shift circuit further includes a switching circuit coupled to the register circuit and the counting control circuit, and receiving the memory access enable signal. The register circuit controls a turn-on state of the switching circuit to determine whether to enable the counting control circuit to receive the memory access enable signal.

In an embodiment of the disclosure, the memory access enable signal is a clock signal, and the counting control circuit is a prescaler.

The disclosure further provides an address generation method of a continuous memory access acceleration circuit, including the following steps. A memory access address is calculated according to temporary data provided by a register circuit. A counting control circuit and a counter are provided, and the counter is controlled by the counting control circuit to accumulate a count value according to access times of a memory. An adder circuit is provided, and the memory access address and the count value are added by the adder circuit to generate a target memory access address.

In an embodiment of the disclosure, the address generation method of the continuous memory access acceleration circuit includes the following. The counter is controlled by the counting control circuit to accumulate the count value in response to the access times of the memory reaching a preset number of times.

In an embodiment of the disclosure, the preset number of times is 2.

In an embodiment of the disclosure, the address generation method of the continuous memory access acceleration circuit includes the following. The access times of the memory is determined according to a memory access enable signal.

Based on the above, in the embodiment of the disclosure, the counting control circuit may automatically control the counter to accumulate the count value according to the access times of the memory, and the adder circuit adds the memory access address and the count value to generate the target memory access address. In this way, when the continuous memory access is performed, the memory address is automatically shifted through the hardware, which may omit some instructions for calculating the memory address, and achieve the hardware acceleration. Especially when the programs that include a large number of continuous memory accesses are performed, the efficiency of digital signal processing is significantly improved.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
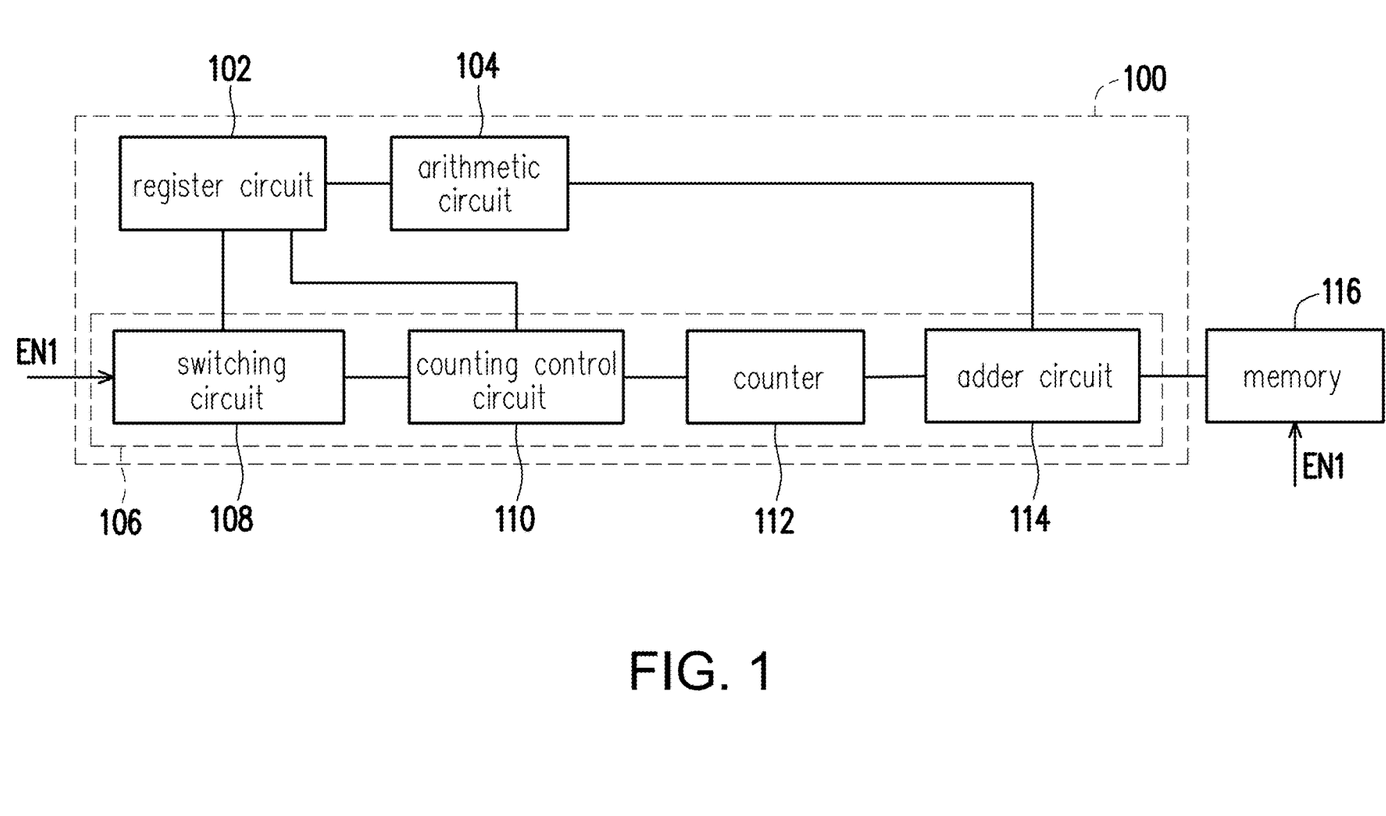
FIG. 1 is a schematic view of a continuous memory access acceleration circuit according to an embodiment of the disclosure.

FIG. 1 is a schematic view of a continuous memory access acceleration circuit according to an embodiment of the disclosure. Referring to FIG. 1, a continuous memory access acceleration circuit 100 may include a register circuit 102, an arithmetic circuit 104, and an address shift circuit 106. The register circuit 102 is coupled to the arithmetic circuit 104 and the address shift circuit 106, and the arithmetic circuit 104 is coupled to the address shift circuit 106. The continuous memory access acceleration circuit 100 may be applied to, for example, a central processing unit or a digital signal processor. That is, the register circuit 102 and the arithmetic circuit 104 may be, for example, a register and an arithmetic logic unit in the central processing unit or the digital signal processor. The arithmetic circuit 104 may perform various operations (such as arithmetic operations, bitwise operations, shift operations, etc., but the disclosure is not limited thereto) according to data provided by the register circuit 102. For example, the arithmetic circuit 104 may calculate a memory access address or perform matrix multiplication, etc., but the disclosure is not limited thereto. The address shift circuit 106 may provide a count value according to access times of a memory 116, and generate a target memory access address for the memory 116 according to the count value and the memory access address calculated by the arithmetic circuit 104, so as to accelerate the continuous memory access.

Further, the address shift circuit 106 may include a switching circuit 108, a counting control circuit 110, a counter 112, and an adder circuit 114. The switching circuit 108 is coupled to the register circuit 102 and the counting control circuit 110. The counting control circuit 110 is coupled to the register circuit 102 and the counter 112. The adder circuit 114 is coupled to the arithmetic circuit 104 and the counter 112. The counter 112 is configured to provide the count value. The counting control circuit 110 may control the counter 112 to accumulate the count value according to the access times of the memory. For example, the counting control circuit 110 may control the counter 112 to accumulate the count value in response to the access times of the memory 116 reaching a preset number of times. The preset number of times may be, for example, 2 times, but the disclosure is not limited thereto. Further, the counting control circuit 110 may, for example, set the preset number of times according to a setting signal, and the setting signal may be provided by, for example, the register circuit 102. However, the disclosure is not limited thereto.

In addition, the counting control circuit 110 may, for example, determine the access times of the memory 116 according to a memory access enable signal EN1. The memory access enable signal EN1 is configured to enable an access operation of the memory 116, and the memory access enable signal EN1 may, for example, a write-enable signal or a read-enable signal. In some embodiments, the memory access enable signal EN1 may be, for example, a clock signal, and the counting control circuit 110 may be, for example, a prescaler. However, the disclosure is not limited thereto. The adder circuit 114 adds the memory access address calculated by the arithmetic circuit 104 and the count value provided by the counter 112 to generate the target memory access address for the memory 116, thereby accelerating the continuous memory access.

In addition, as shown in FIG. 1, the memory access enable signal EN1 may be provided to the counting control circuit 110 through the switching circuit 108, and the register circuit 102 may control a turn-on state of the switching circuit 108 to determine whether to provide the memory access enable signal EN1 to the counting control circuit 110. When the switching circuit 108 is in a turn-off state, the counting control circuit 110 does not control the counter 112 to provide the count value according to the access times of the memory 116. In some embodiments, the address shift circuit 106 may also not include the switching circuit 108, and the register circuit 102 directly controls whether the counting control circuit 110 controls the counter 112 to provide the count value according to the access times of the memory 116.

Figure 2:
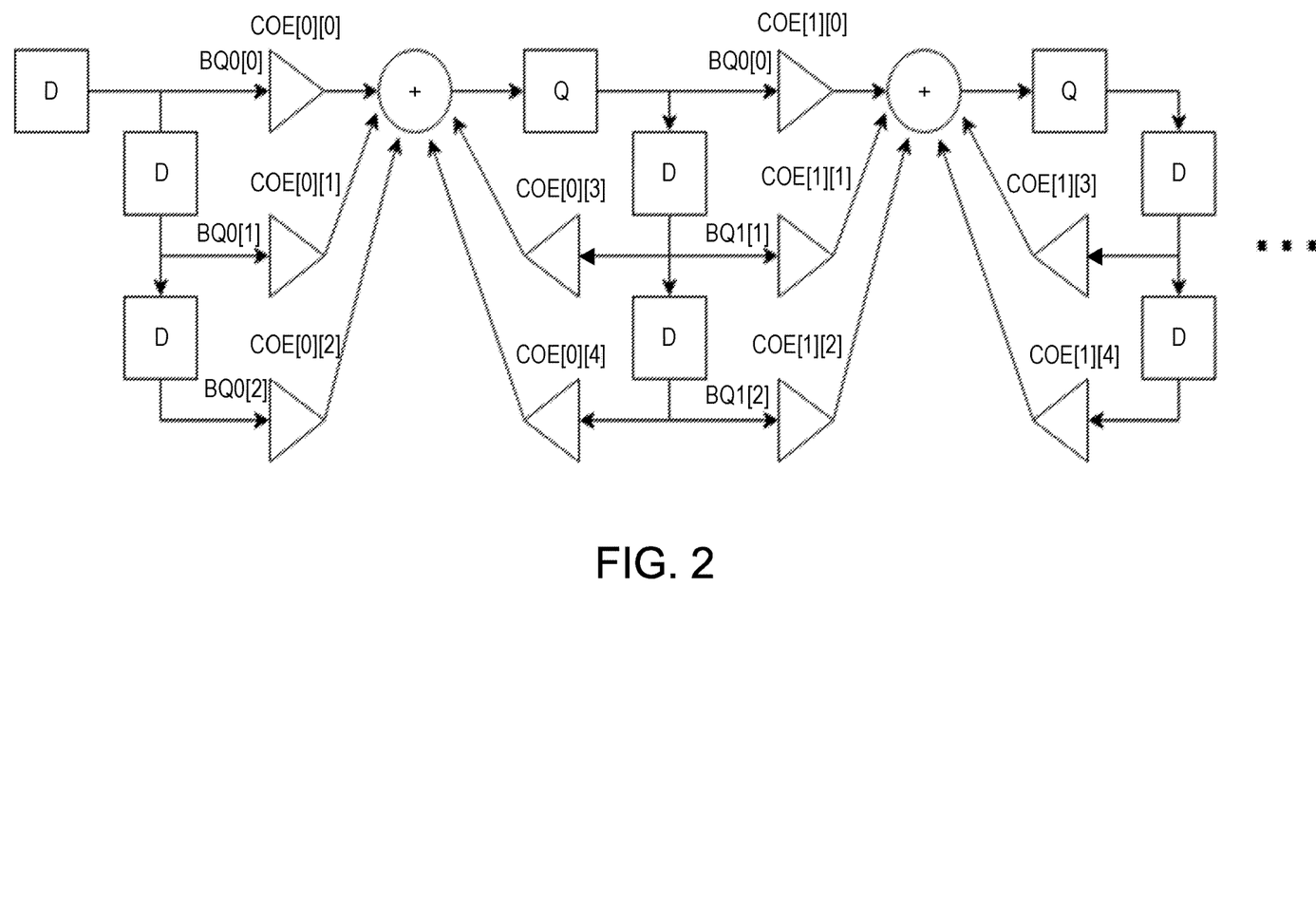
FIG. 2 is a schematic view of a biquad filter according to an embodiment of the disclosure.

The continuous memory access acceleration circuit 100 may be applied to different digital signal processing, and improves work efficiency of the central processing unit or the digital signal processor by accelerating the continuous memory access. For example, the continuous memory access acceleration circuit 100 may apply a biquad filter as shown in FIG. 2. In the embodiment of FIG. 2, each of the biquad filters requires 3 data sample buffers and 5 coefficient buffers. C language codes for the biquad filter may be represented by the following. for (i=0, i<16, i++)

$BQ[i][0]=BQ[i][0]*COE[i][0]+BQ[i][1]*COE[i][1]+BQ[i][2]*COE[i][2]+BQ[i+1][1]*COE[i][3]+BQ[i+1][2]*COE[i][4]$

Figure 3:
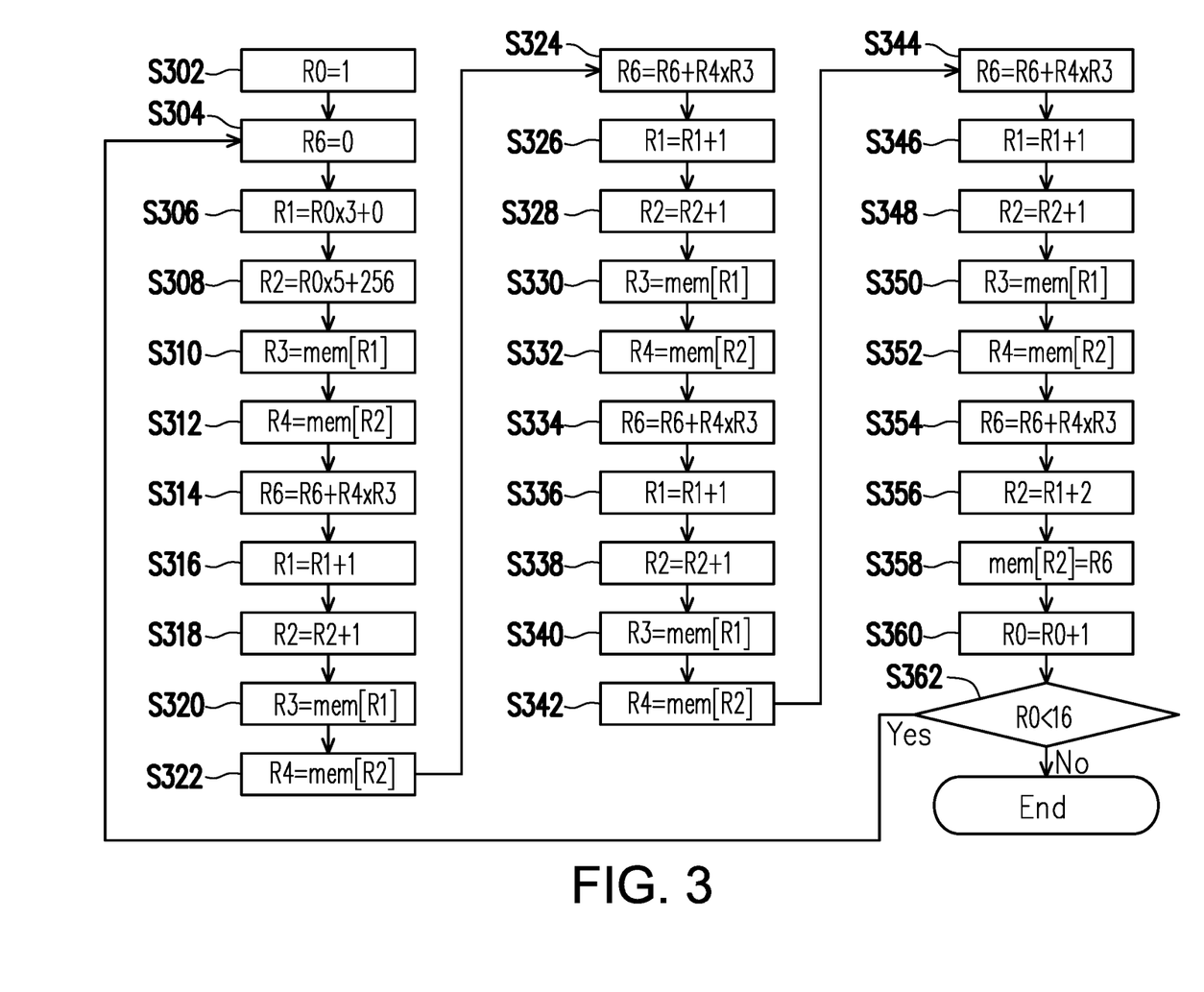
FIG. 3 is a flowchart of signal processing of a conventional biquad filter.

BQ[i][0] to BQ[i+1][2] are input data samples, and COE[i][0] to COE[i][4] are filter coefficients. FIG. 3 is a flowchart of digital signal processing when a biquad filter is implemented on a hardware circuit shown in FIG. 1. In the embodiment of FIG. 3, the register circuit 102 controls the switching circuit 108 to be in the turn-off state, and the counting control circuit 110 does not control the counter 112 to provide the count value according to the access times of the memory 116. In step S302, a preset data (for example, "1", but the disclosure is not limited thereto) is stored in a register R0. In step S304, the preset data (for example, "0", but the disclosure is not limited thereto) is stored in a register R6 (step S304). In step S306, the arithmetic circuit 104 calculates the data (R1=R0×3+0) in a register R1 according to the data in the register R0. In step S308, the arithmetic circuit 104 calculates the data (R2=R0×5+256) in a register R2 according to the data in the register R0. In step S310, the arithmetic circuit 104 writes the data corresponding to a memory address stored in the register R1 into a register R3. In step S312, the arithmetic circuit 104 writes the data corresponding to the memory address stored in the register R2 into a register R4. In step S314, the arithmetic circuit 104 updates the data (R6=R6+R4×R3) in the register R6 according to the data in the registers R3, R4, and the register R6, so that the data in the register R6 is BQ[0][0]*COE[0][0]. In step S316, the arithmetic circuit 104 updates the data in the register R1, and adds 1 (R1=R1+1) to the data in the register R1. In step S318, the arithmetic circuit 104 updates the data in the register R2, and adds 1 (R2=R2+1) to the data in the register R2. In step S320, the arithmetic circuit 104 writes the data corresponding to the memory address stored in the register R1 into the register R3. In step S322, the arithmetic circuit 104 writes the data corresponding to the memory address stored in the register R2 into the register R4. In step S324, the arithmetic circuit 104 updates the data (R6=R6+R4×R3) in the register R6 according to the data in the registers R3, R4, and the register R6, so that the data in the register R6 is BQ[0][0]*COE[0][0]+BQ[0][1]*COE[0][1]. In step S326, the arithmetic circuit 104 updates the data in the register R1, and adds 1 (R1=R1+1) to the data in the register R1. In step S328, the arithmetic circuit 104 updates the data in the register R2, and adds 1 (R2=R2+1) to the data in the register R2. In step S330, the arithmetic circuit 104 writes the data corresponding to the memory address stored in the register R1 into the register R3. In step S332, the arithmetic circuit 104 writes the data corresponding to the memory address stored in the register R2 into the register R4. In step S334, the arithmetic circuit 104 updates the data (R6=R6+R4×R3) in the register R6 according to the data in the registers R3, R4, and the register R6, so that the data in the register R6 is BQ[0][0]*COE[0][0]+BQ[0][1]*COE[0][1]+BQ[0][2]*COE[0][2]. In step S336, the arithmetic circuit 104 updates the data in the register R1, and adds 2 (R1=R1+2) to the data in the register R1. In step S338, the arithmetic circuit 104 updates the data in the register R2, and adds 1 (R2=R2+1) to the data in the register R2. In step S340, the arithmetic circuit 104 writes the data corresponding to the memory address stored in the register R1 into the register R3. In step S342, the arithmetic circuit 104 writes the data corresponding to the memory address stored in the register R2 into the register R4. In step S344, the arithmetic circuit 104 updates the data (R6=R6+R4×R3) in the register R6 according to the data in the registers R3, R4, and the register R6, so that the data in the register R6 is BQ[0][0]*COE[0][0]+BQ[0][1]*COE[0][1]+BQ[0][2]*COE[0][2]+BQ[1][1]*COE[0][3]. In step S346, the arithmetic circuit 104 updates the data in the register R1, and adds 1 (R1=R1+1) to the data in the register R1. In step S348, the arithmetic circuit 104 updates the data in the register R2, and adds 1 (R2=R2+1) to the data in the register R2. In step S350, the arithmetic circuit 104 writes the data corresponding to the memory address stored in the register R1 into the register R3. In step S352, the arithmetic circuit 104 writes the data corresponding to the memory address stored in the register R2 into the register R4. In step S354, the arithmetic circuit 104 updates the data (R6=R6+R4×R3) in the register R6 according to the data in the registers R3, R4, and the register R6, so that the data in the register R6 is BQ[0][0]*COE[0][0]+BQ[0][1]*COE[0][1]+BQ[0][2]*COE[0][2]+BQ[1][1]*COE[0][3]+BQ[1][2]*COE[0][4]. In step S356, the arithmetic circuit 104 updates the register R2, and adds 2 (R2=R2+2) to the register R2. In step S358, the arithmetic circuit 104 stores the data in the register R6 to the memory address stored in the register R2. In step S360, the arithmetic circuit 104 updates the data in the register R0, and adds 1 (R0=R0+1) to the data in the register R0. In step S360, the arithmetic circuit 104 determines whether the data in the register R0 is less than 16. If the data in the register R0 is not less than 16, the digital signal processing is ended, and if the data in the register R0 is less than 16, the process returns to step S304 to continue to perform the digital signal processing.

Figure 4:
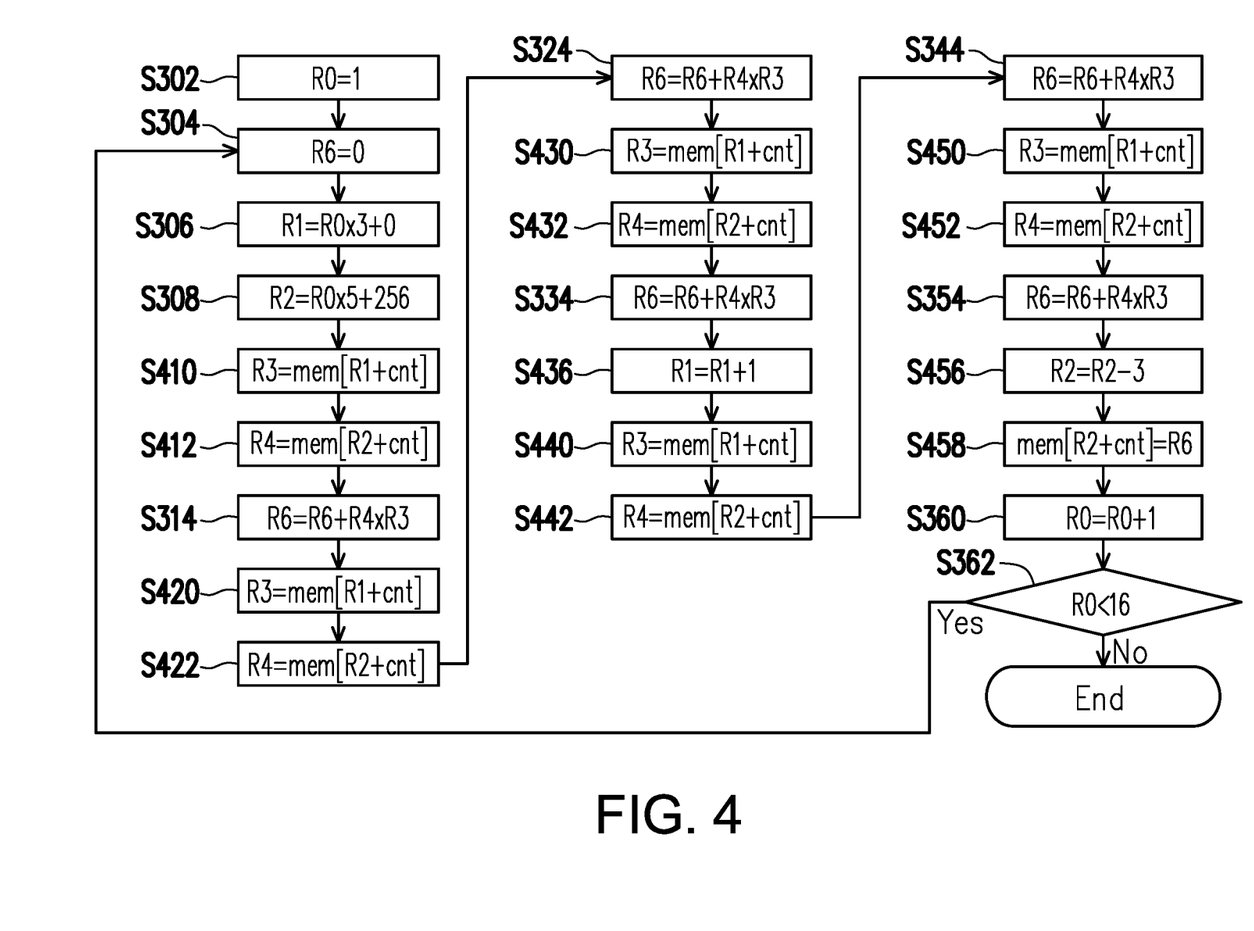
FIG. 4 is a flowchart of signal processing of a biquad filter using a continuous memory access acceleration circuit according to an embodiment of the disclosure.

FIG. 4 is a flowchart of digital signal processing when the biquad filter is implemented on the hardware circuit shown in FIG. 1 according to another embodiment of the disclosure. In the embodiment of FIG. 4, the register circuit 102 controls the switching circuit 108 to be in the turn-on state, and the counting control circuit 110 controls the counter 112 to provide the count value according to the access times of the memory 116. Specifically, the counting control circuit 110 controls the counter 112 to accumulate the count value in response to the access times of the memory 116 reaching 2 times (in which the preset number of times is 2 times). A difference between this embodiment and the embodiment in FIG. 3 is that in this embodiment, the counting control circuit 110 may automatically control the counter 112 to provide the count value according to the access times of the memory 116, and the adder circuit 114 adds the memory address calculated by the arithmetic circuit 104 and the count value provided by the counter 112 to obtain a target memory address. For example, in steps S410 and S412, the adder circuit 114 adds the memory addresses stored in the registers R1 and R2 calculated by the arithmetic circuit 104 and a count value cnt provided by the counter 112 to generate the target memory address, and respectively writes the data corresponding to the target memory address into the registers R3 and R4. Compared to the embodiment of FIG. 3, in the embodiment of FIG. 4, the counting control circuit 110 may automatically control the counter 112 to provide the count value according to the access times of the memory 116 (for example, when an initial value of the count value cnt of the counter 112 is 0, the counting control circuit 110 controls the counter 112 to accumulate the count value cnt to 1 in response to the memory accesses in steps S410 and S412), and the adder circuit 114 adds the memory addresses stored in the registers R1 and R2 and the count value cnt of the counter 112, so as to automatically perform the memory address shift to obtain the target memory address. In this way, the arithmetic circuit 104 may omit the instructions (R1=R1+1 and R2=R2+1) for the memory address shift in steps S316 and S318, directly enter step S420 to write the data corresponding to the target memory address (R1+cnt) provided by the adder circuit 114 into the register R3, and in step S422, write the target memory address (R2+cnt) provided by the adder circuit 114 into the register R4. By analogy, steps S326, S328, S338, S346, and S348 in the embodiment of FIG. 3 may also be omitted and are not required to be performed, and steps S430, S432, S450, and S452 are modified to be similar to the implementations in steps S420 and S422. When the count value cnt corresponding to steps S420 and S422 is 1, the count value cnt corresponding to steps S430 and S432 is 2; the count value cnt corresponding to steps S440 and S442 is 3; the count value cnt corresponding to steps S450 and S452 is 4, and the count value cnt corresponding to step S458 is 5. In addition, steps S336 and S356 in the embodiment of FIG. 3 are adjusted correspondingly. In the embodiment of FIG. 4, step S336 in the embodiment of FIG. 3 is adjusted to step S436, that is, adding 1 (R1=R1+1) to the data in the register R1, while step S356 in the embodiment of FIG. 3 is adjusted to step S456, that is, subtracting 3 (R2=R2−3) from the data in the register R2.

In this way, the counting control circuit 110 automatically controls the counter 112 to accumulate the count value according to the access times of the memory 116, and the adder circuit 114 adds the memory access address and the count value to generate the target memory access address. When the continuous memory access is performed, the memory address may be automatically shifted through the hardware, and some instructions for calculating the memory address are omitted, so as to achieve hardware acceleration. When programs that include a large number of continuous memory accesses are performed, the efficiency of digital signal processing is significantly improved.

Figure 5:
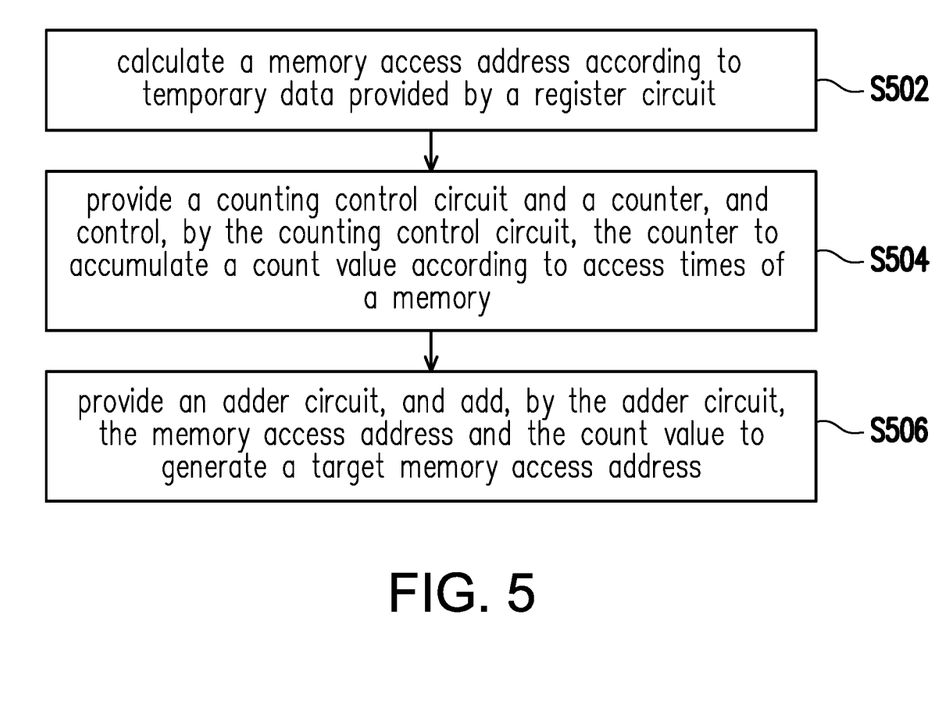
FIG. 5 is a flowchart of a memory address generation method of a continuous memory access acceleration circuit according to another embodiment of the disclosure.

FIG. 5 is a flowchart of a memory address generation method of a continuous memory access acceleration circuit according to another embodiment of the disclosure. In light of the above embodiments, the memory address generation method of the continuous memory access acceleration circuit may include the following steps. First, a memory access address is calculated according to temporary data provided by a register circuit (step S502). Next, a counting control circuit and a counter are provided, and the counting control circuit controls the counter to accumulate a count value according to access times of a memory (step S504). For example, the counting control circuit may control the counter to accumulate the count value in response to the access times of the memory reaching a preset number of times. The preset number of times may be, for example, 2, but the disclosure is not limited thereto. As the continuous memory access acceleration circuit is applied to different digital signal processing, the preset number of times may be set to different times. The counting control circuit may, for example, set the preset number of times according to a setting signal, and the setting signal may be, for example, from the register circuit. However, the disclosure is not limited thereto. In addition, the counting control circuit may, for example, determine the access times of the memory according to a memory access enable signal. Then, an adder circuit is provided, and the adder circuit adds the memory access address and the count value to generate a target memory access address (step S506).

Based on the above, in the embodiment of the disclosure, the counting control circuit may automatically control the counter to accumulate the count value according to the access times of the memory, and the adder circuit adds the memory access address and the count value to generate the target memory access address. In this way, when the continuous memory access is performed, the memory address is automatically shifted through the hardware, which may omit some instructions for calculating the memory address, and achieve the hardware acceleration. Especially when the programs that include a large number of continuous memory accesses are performed, the efficiency of digital signal processing is significantly improved.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A continuous memory access acceleration circuit for signal processing of a biquad filter, comprising:
   a register circuit;
   an arithmetic circuit coupled to the register circuit and calculating a memory access address according to temporary data provided by the register circuit; and
   an address shift circuit coupled to the register circuit and the arithmetic circuit, wherein the address shift circuit comprises:
   a counter providing a count value;
   a counting control circuit coupled to the register circuit and the counter and controlling the counter to accumulate the count value according to a number of times a memory is accessed, wherein the counting control circuit controls the counter to accumulate the count value in response to the number of times memory are accessed reaching a preset number of times, the preset number of times is 2; and
   an adder circuit coupled to the arithmetic circuit and the counter and adding the memory access address and the count value to generate a target memory access address.

2. The continuous memory access acceleration circuit according to claim 1, wherein the counting control circuit sets the preset number of times according to a setting signal.

3. The continuous memory access acceleration circuit according to claim 2, wherein the register circuit provides the setting signal.

4. The continuous memory access acceleration circuit according to claim 1, wherein the counting control circuit determines the number of times memory addresses are read from the memory according to a memory access enable signal.

5. The continuous memory access acceleration circuit according to claim 4, wherein the address shift circuit further comprises:
   a switching circuit coupled to the register circuit and the counting control circuit and receiving the memory access enable signal, wherein the register circuit controls a turn-on state of the switching circuit to determine whether to enable the counting control circuit to receive the memory access enable signal.

6. The continuous memory access acceleration circuit according to claim 4, wherein the memory access enable signal is a clock signal, and the counting control circuit is a prescaler.

7. An address shift circuit of a continuous memory access acceleration circuit for signal processing of a biquad filter, comprising:
   a counter providing a count value;
   a counting control circuit coupled to the counter and controlling the counter to accumulate the count value according to a number of times memory are accessed, wherein the counting control circuit controls the counter to accumulate the count value in response to the number of times a memory is accessed reaching a preset number of times, the preset number of times is 2; and an adder circuit coupled to the counter and adding a memory access address and the count value to generate a target memory access address.

8. The address shift circuit of the continuous memory access acceleration circuit according to claim 7, wherein the counting control circuit sets the preset number of times according to a setting signal.

9. The address shift circuit of the continuous memory access acceleration circuit according to claim 8, wherein the setting signal is from a register circuit.

10. The address shift circuit of the continuous memory access acceleration circuit according to claim 7, wherein the counting control circuit determines the number of times memory addresses are read from the memory according to a memory access enable signal.

11. The address shift circuit of the continuous memory access acceleration circuit according to claim 10, wherein the address shift circuit further comprises:

a switching circuit coupled to a register circuit and the counting control circuit and receiving the memory access enable signal, wherein the register circuit controls a turn-on state of the switching circuit to determine whether to enable the counting control circuit to receive the memory access enable signal.

12. The address shift circuit of the continuous memory access acceleration circuit according to claim 10, wherein the memory access enable signal is a clock signal, and the counting control circuit is a prescaler.

13. An address generation method of a continuous memory access acceleration circuit for signal processing of a biquad filter, comprising:

calculating a memory access address according to temporary data provided by a register circuit;

providing a counting control circuit and a counter, and controlling, by the counting control circuit, the counter to accumulate a count value according to a number of times memory are accessed;

controlling, by the counting control circuit, the counter to accumulate the count value in response to the number of times a memory is accessed reaching a preset number of times, the preset number of times is 2; and providing an adder circuit, and adding, by the adder circuit, the memory access address and the count value to generate a target memory access address.

14. The address generation method of the continuous memory access acceleration circuit according to claim 13, comprising:

determining the number of times memory addresses are read from the memory according to a memory access enable signal.

* * * * *